(12) United States Patent
Chung et al.

(10) Patent No.: US 7,518,879 B2
(45) Date of Patent: Apr. 14, 2009

(54) UNIVERSAL SERIAL BUS (USB) MEMORY PLUG

(75) Inventors: Tom Chung, Hsinchu (TW); Dean Huang, Hsinchu (TW); Peter Huang, Hsinchu (TW)

(73) Assignee: Phison Electronics Corp., Chutung, Hsinchu (TW)

( * ) Notice: Subject to any disclaimer, the term of this patent is extended or adjusted under 35 U.S.C. 154(b) by 361 days.

(21) Appl. No.: 11/384,371

(22) Filed: Mar. 21, 2006

(65) Prior Publication Data
US 2007/0245047 A1    Oct. 18, 2007

(51) Int. Cl.
*H05K 1/03* (2006.01)
(52) U.S. Cl. ..................... 361/737; 174/255
(58) Field of Classification Search .............. 361/737; 439/638, 351–353, 607; 174/255
See application file for complete search history.

(56) References Cited

U.S. PATENT DOCUMENTS

2004/0087213 A1* 5/2004 Kao ........................ 439/638
2007/0066119 A1* 3/2007 Wu et al. .................. 439/378
2007/0127223 A1* 6/2007 Mitsuhashi ............... 361/752
2007/0178769 A1* 8/2007 Ni ........................... 439/660
2008/0064272 A1* 3/2008 Miller et al. .............. 439/892
2008/0076280 A1* 3/2008 Chi et al. .................. 439/131

FOREIGN PATENT DOCUMENTS

| CN | 2142631 Y | 9/1993 |
| CN | 1632987 A | 6/2005 |
| CN | 2731910 Y | 10/2005 |
| JP | 2004-103907 | 2/2004 |
| JP | 3099411 | 4/2004 |

* cited by examiner

*Primary Examiner*—Dean A. Reichard
*Assistant Examiner*—Yuriy Semenenko
(74) *Attorney, Agent, or Firm*—Bacon & Thomas, PLLC

(57) ABSTRACT

A universal serial bus (USB) memory is disclosed. The USB memory includes a housing having a plurality of orientated indentations and a plurality of concave props, wherein the plurality of orientated indentation facilitates the USB memory to be connected while the USB memory is inserted into a female USB socket; a print circuit board assembly (PCBA) disposed in the housing, wherein the PCBA is fixed by means of pressing of the plurality of concave props; and a LED module having a LED indicator disposed in the housing and a LED module controller disposed on the PCBA, wherein a space is formed between the housing and the PCBA for disposing the LED module.

21 Claims, 5 Drawing Sheets

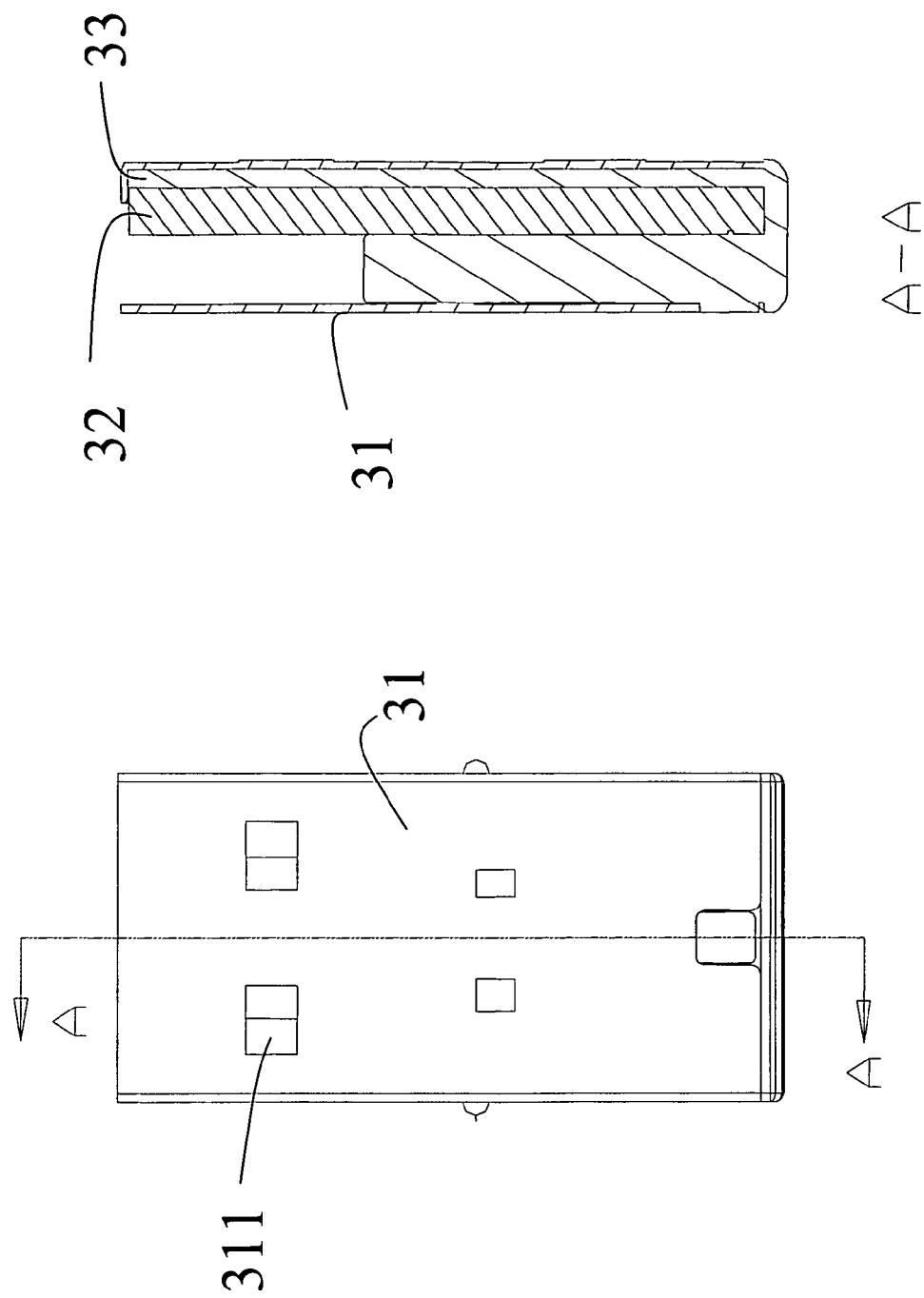

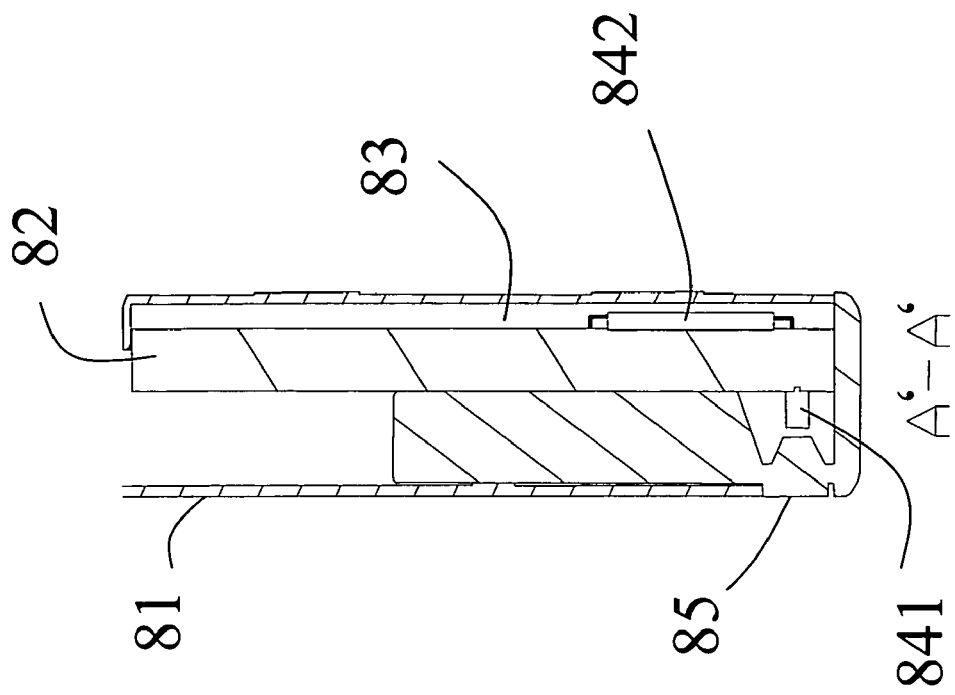
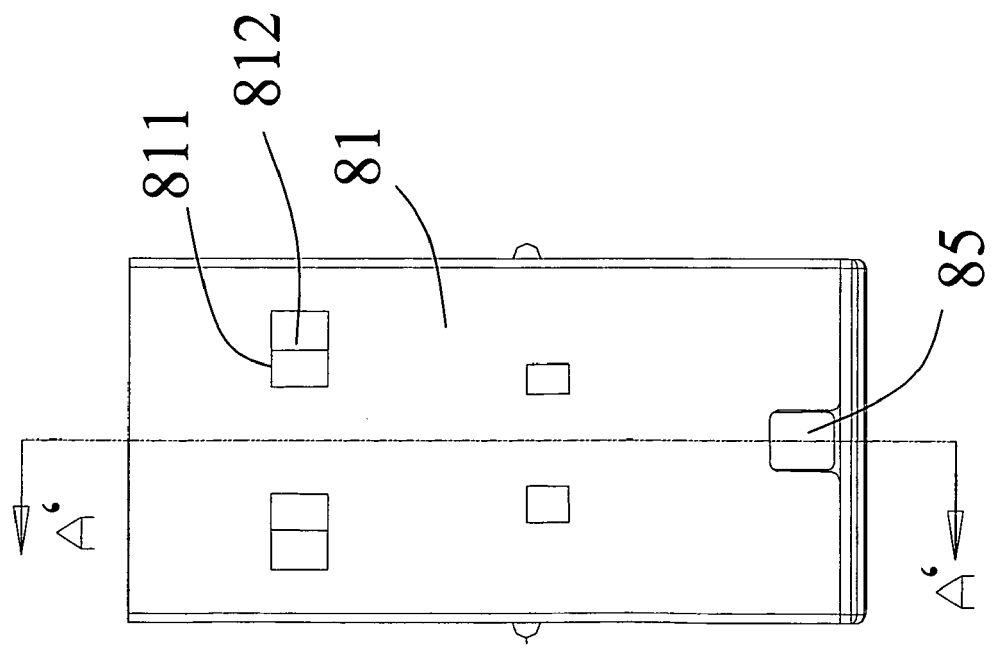
Fig. 9
Fig. 8

UNIVERSAL SERIAL BUS (USB) MEMORY PLUG

FIELD OF THE INVENTION

The present invention relates to a Universal Serial Bus (USB) memory apparatus, and more particularly, to a miniaturized Universal Serial Bus (USB) memory apparatus.

BACKGROUND OF THE INVENTION

The capabilities of a computer are maximized by utilizing a variety of external peripheral devices that are connected to the computer. This may involve any number of peripherals. In response to computers becoming more modular, a Universal Serial Bus (USB) interface standard was jointly developed. The USB standard defines a high-speed serial data interface between a computer and add-on devices, such as keyboards, printers, scanners and secondary storage devices, including floppy disk drives, hard disk drives, and solid-state secondary storage drives. In computers that have USB compliant ports, such devices can be added or removed while the computer is powered up and running.

With the growing popularity of portable computing devices having USB compliant ports, such as notebook, tablet computers, and personal digital assistants (PDA), the USB ports afford on-the-go flexibility to a user of the portable computing device. That is, the user of a notebook can carry multiple external peripheral devices, and simply plug the needed external peripheral device into the portable computing device when needed.

Recently, flash memory cards are also being sold that contain a USB connector. Such USB-flash memory cards do not require a specialized reader but can be plugged into a USB connector on a personal computer (PC) or other hosting device. These USB-flash memory cards can be used in place of floppy disks and are known as USB key drives, USB thumb drives, and a variety of other names. These USB-flash cards can have a capacity of more than ten floppy disks in an area not much larger than a large postage stamp.

FIG. 1 shows an assembly of a male slim USB connector that is integrated with a circuit-board substrate of a flash memory card according to the prior art; and FIG. 2 shows a cross-sectional view of AA-AA in FIG. 1. As shown in FIGS. 1 and 2, the miniaturized USB Pen Driver includes a metallic conductive housing 11 having a plurality of orientated indentation 111, and a print circuit board assembly (PCBA) 12 for providing storing memory. Furthermore, the thickness of the print circuit board assembly (PCBA) 12 is usually insufficient, thereby making data reading and storing difficult. Therefore, in order to overcome this drawback, the height needs to be increased with the aid of another object.

Consequently, the miniaturized USB Pen Driver also includes a flake spacer 13 disposed between the metallic conductive housing 11 and the PCBA 12 for fitting the PCBA 12 in the metallic conductive housing 11 tightly, wherein the flake spacer 13 could be made from a metallic slice or a plastic (Mylar) slice. The flake spacer 13 is used to fill up the space between the metallic conductive housing and the PCBA 12. However, in practice, the flake spacer 13 is not easy to be fabricated into the space between the metallic conductive housing 11 and the PCBA 12. Therefore, the USB Pen Driver of the prior art could not be miniaturized effectively.

FIG. 3 shows an assembly of USB memory apparatus according to the prior art, and FIG. 4 shows a cross-sectional view of A-A in FIG. 3. As shown in FIGS. 3 and 4, the USB memory apparatus includes a metallic conductive housing 31 having a plurality of orientated indentation 311, and a print circuit board assembly (PCBA) 32 for providing storing memory. Similarly, the miniaturized USB memory apparatus also includes a flake spacer 33 disposed between the metallic conductive housing 31 and the PCBA 32 for fitting the PCBA 32 in the metallic conductive housing 31 tightly. Due to the flake spacer 33, the inner space of the metallic conductive housing 31 is further decreased. In practice, there is no enough space for introducing a LED indicator. If a LED indicator should be introduced into the USB memory apparatus, the prior art has to add extra space for containing the module of the LED indicator. Therefore, the USB memory apparatus of the prior art can not introduce a LED indicator without increasing extra space, and can not be miniaturized effectively Although such multi-application USB memory apparatuses are technically feasible, in practice they are very difficult to implement, as demonstrated by numerous pioneering attempts ever since the invention of the miniaturized USB memory apparatus itself. It needs to provide a miniaturized Universal Serial Bus (USB) memory apparatus, which decreases the cost, simplifies the manufacturing process, is capable of introducing extra module, such as a LED indicator into the USB memory apparatus without increasing entirety volume thereof, and can rectify those drawbacks of the prior art and solve the above problems.

SUMMARY OF THE INVENTION

This paragraph extracts and compiles some features of the present invention; other features will be disclosed in the follow-up paragraph. It is intended to cover various modifications and similar arrangements included within the spirit and scope of the appended claims, and this paragraph also is considered to refer.

Accordingly, the prior art is limited by the above problems. It is an object of the present invention to provide a Universal Serial Bus (USB) memory apparatus, and in particular a USB memory plug, which decreases the cost, simplifies the manufacturing process, and is capable of introducing an extra module, such as a LED indicator, into the USB memory apparatus without increasing entirely the volume thereof.

In accordance with an aspect of the present invention, the USB memory apparatus includes a housing having a plurality of orientated indentations and a plurality of concave props, wherein the plurality of orientated indentation facilitates the USB memory apparatus to be connected while the USB memory apparatus is inserted into a female USB socket; and a print circuit board assembly (PCBA) disposed in the housing, wherein the PCBA is fixed by means of pressing of the plurality of concave props, and a space is formed between the housing and the PCBA.

Preferably, the housing is made from a metallic conductive material.

Certainly, the plurality of orientated indentations and the plurality of concave props are integrally formed by means of punching on the housing.

Preferably, the PCBA further includes a memory controller; a storage memory in communication with the memory controller; a USB interface circuit in communication with the memory controller; and an integrated circuit package for accommodating the memory controller, the storage memory, and the USB interface together within physical dimensions of the USB memory apparatus.

Preferably, the storage memory is one of a flash memory and an Electrically Erasable Programmable Read Only Memory (EEPROM).

Certainly, further includes a LED indicator for indicating operation of the USB memory apparatus.

Preferably, the PCBA further includes a LED module controller for controlling the LED indicator.

Preferably, the housing further includes an opening for positioning the LED indicator.

According to the present invention, the USB memory apparatus includes a print circuit board assembly (PCBA); and a housing having a plurality of concave props, wherein the PCBA is disposed in the housing; the plurality of concave props protrude inward to fix the PCBA, and a space is formed between the housing and the PCBA.

Preferably, the housing is made from a metallic conductive material.

Preferably, the plurality of concave props are formed by means of punching on the housing.

Preferably, the PCBA further includes a memory controller; a storage memory in communication with the memory controller; a USB interface circuit in communication with the memory controller; and an integrated circuit package for accommodating the memory controller, the storage memory, and the USB interface together within physical dimensions of the USB memory apparatus.

Preferably, the storage memory is one of a flash memory and an Electrically Erasable Programmable Read Only Memory (EEPROM).

Certainly, further includes a LED indicator for indicating operation of the USB memory apparatus.

Preferably, the PCBA further includes a LED module controller for controlling the LED indicator.

Preferably, the housing further includes an opening for positioning the LED indicator.

In accordance with another aspect of the present invention, the USB memory apparatus includes a housing having a plurality of orientated indentations and a plurality of concave props, wherein the plurality of orientated indentation facilitates the USB memory apparatus to be connected while the USB memory apparatus is inserted into a female USB socket; an print circuit board assembly (PCBA) disposed in the housing wherein the PCBA is fixed by means of pressing of the plurality of concave props; and a LED module having a LED indicator disposed in the housing and a LED module controller disposed on the PCBA, wherein a space is formed between the housing and the PCBA for disposing the LED module.

Preferably, the housing further includes an opening for positioning the LED indicator.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 3 illustrates an assembly of USB memory apparatus according to the prior art.

FIG. 4 illustrates a cross-sectional view of A-A in FIG. 3

FIG. 8 illustrates another preferred embodiment of a USB memory apparatus according to the present invention.

FIG. 9 illustrates a cross-sectional view of A'-A' in FIG. 8.

DETAILED DESCRIPTION OF THE PREFERRED EMBODIMENT

The present invention discloses a Universal Serial Bus (USB) memory apparatus, and the objects and advantages of the present invention will become more readily apparent to those ordinarily skilled in the art after reviewing the following detailed description. The present invention needs not be limited to the following embodiment.

Figure 2:
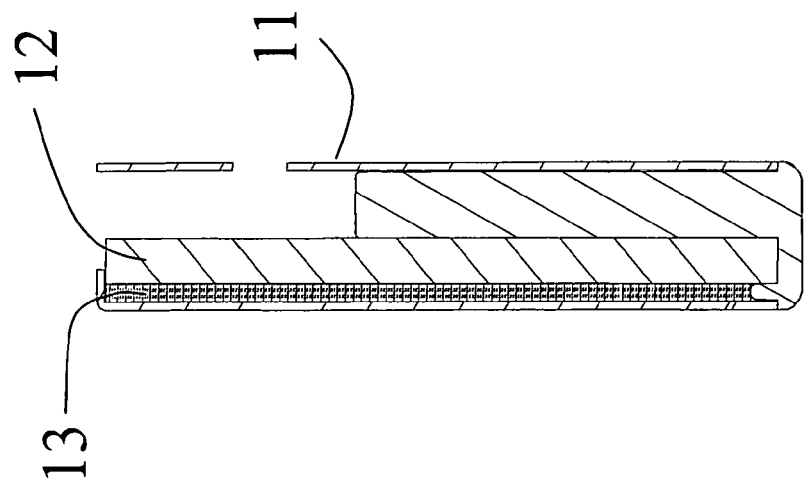
FIG. 2 illustrates a cross-sectional view of AA-AA in FIG. 1.
Figure 1:
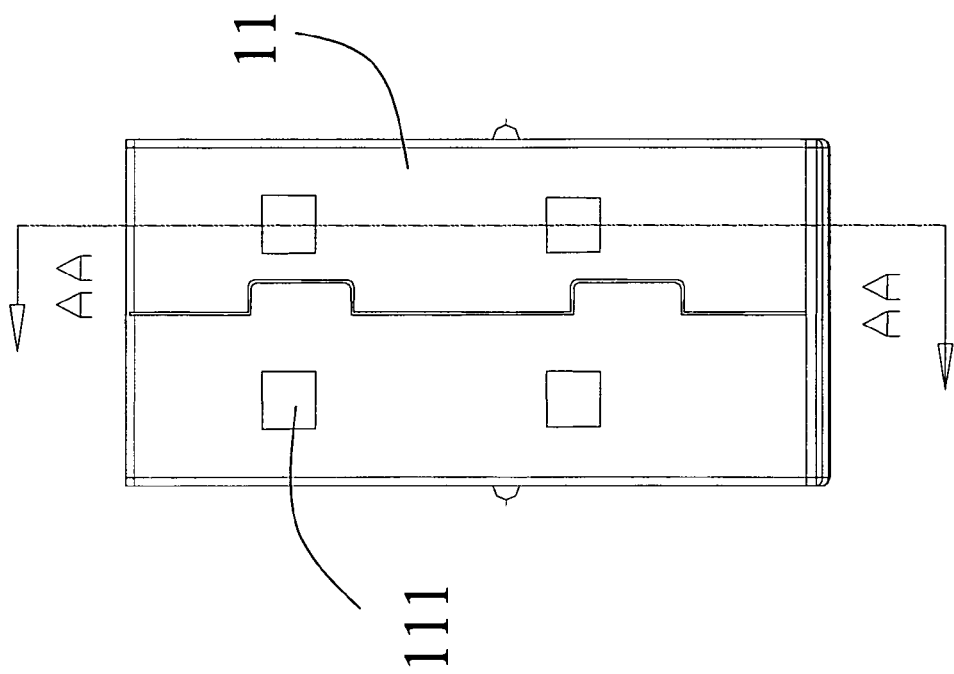
FIG. 1 illustrates an assembly of a male slim USB connector that is integrated with a circuit-board substrate of a flash memory card according to the prior art.
Figure 6:
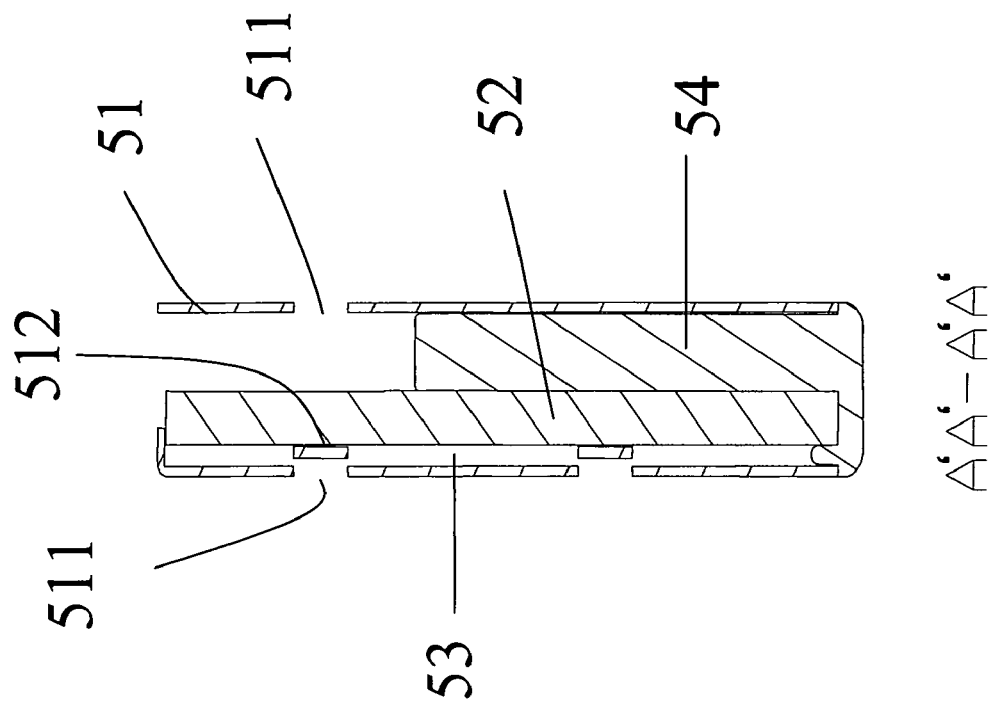
FIG. 6 illustrates a cross-sectional view of A'A'-A'A' in FIG. 5.
Figure 5:
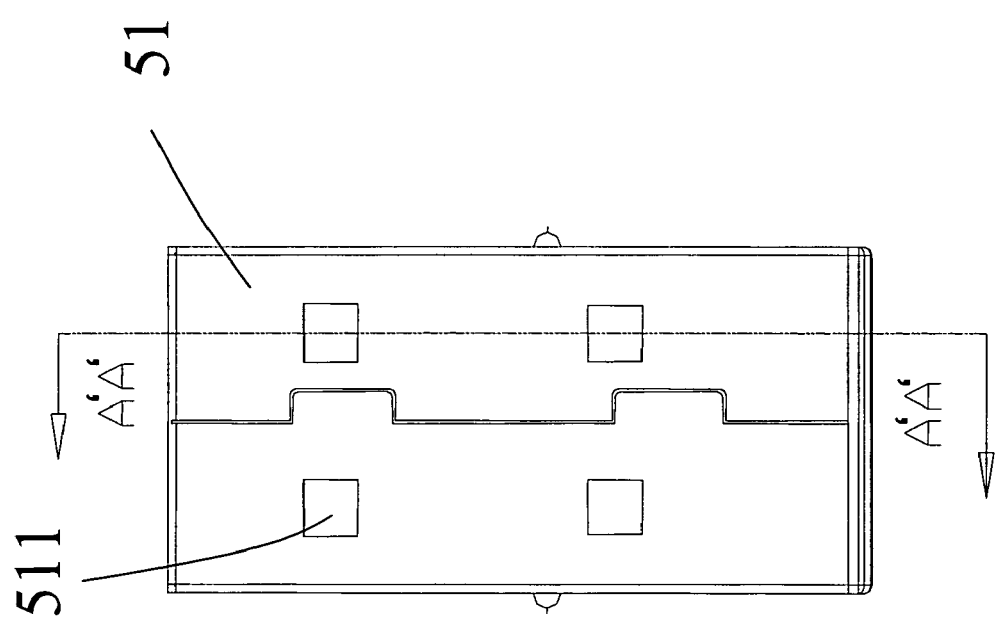
FIG. 5 illustrates a preferred embodiment of a USB memory apparatus according to the present invention.

Please refer to FIG. 5 and FIG. 6. Meanwhile, FIG. 5 illustrates a preferred embodiment of a USB memory apparatus according to the present invention, and FIG. 6 illustrates a cross-sectional view of A'A'-A'A' in FIG. 5. As shown in FIGS. 5 and 6, the USB memory apparatus includes a housing 51 having a plurality of orientated indentations 511 and a plurality of concave props 512, wherein the plurality of orientated indentation 511 facilitates the USB memory apparatus to be connected while the USB memory apparatus is inserted into a female USB socket (not shown); and a print circuit board assembly (PCBA) 52 disposed in the housing 51, wherein the PCBA 52 is fixed by means of pressing of the plurality of concave props 512; and there is a space 53 between the housing 51 and the PCBA 52.

Figure 7:
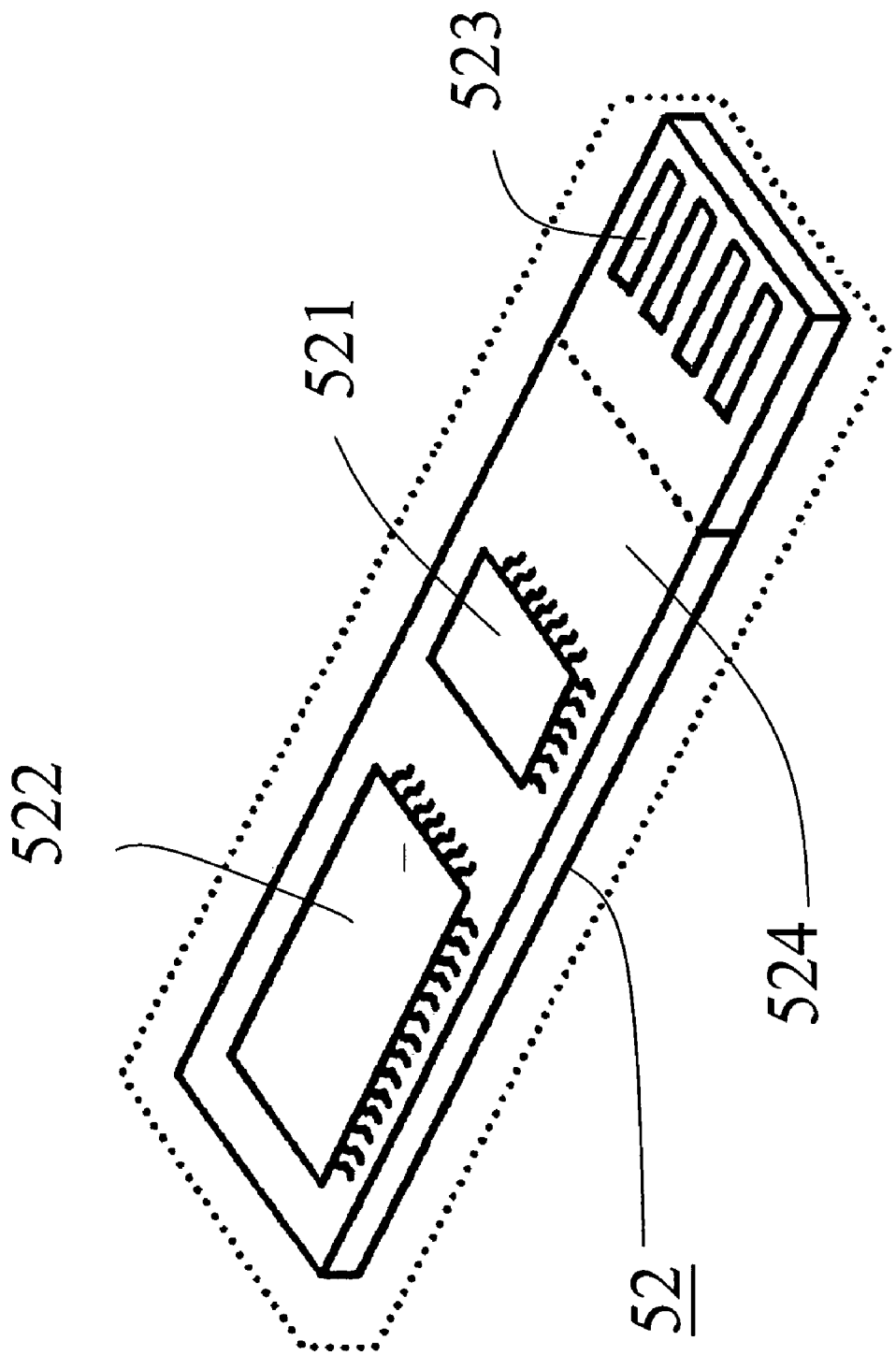
FIG. 7 illustrates a PCBA according to the present invention.

In practice, the housing 51 is usually made from a metallic conductive material, wherein the plurality of orientated indentations 511 and the plurality of concave props 512 can be formed simultaneously by means of punching on the housing 51. In this embodiment, one end of the housing 51 is also regarded as a USB male connector, and then the height of the insertion end of the housing 51 is the same as a standard height of a standard USB male connector. Meanwhile, the plurality of orientated indentations 511 are located to engage metal springs on the USB socket (not shown), whereby the plurality of orientated indentations provide a secure fit into the USB socket when inserted. Moreover, the PCBA 52 is combined with an end base 54. Usually, the PCBA 52 should include several components. Please refer to FIG. 7. It illustrates a PCBA according to the present invention, wherein the PCBA 52 further includes a memory controller 521; a storage memory 522 in communication with the memory controller 521; a USB interface circuit 523 in communication with the memory controller 521; and an integrated circuit package 524 for maintaining the memory controller 521, the storage memory 522, and the USB interface 523 together within physical dimensions of the USB memory apparatus. Meanwhile, the storage memory 522 is one of a flash memory and an Electrically Erasable Programmable Read Only Memory (EEPROM). Certainly, the PCBA 52 could introduce any electronic component according to the requirement. Specially, the USB memory apparatus of the present invention could introduce more components by means of using to the space 53 between the housing 51 and the PCBA 52.

Please refer to FIG. 8 and FIG. 9. Meanwhile, FIG. 8 illustrates another preferred embodiment of a USB memory apparatus according to the present invention, and FIG. 9 illustrates a cross-sectional view of A'-A' in FIG. 8. As shown in FIGS. 8 and 9, the USB memory apparatus includes a housing 81 having a plurality of orientated indentations 811 and a plurality of concave props 812, wherein the plurality of orientated indentation 811 (which is located to engage metal springs on the female USB socket) facilitates the USB memory apparatus to be connected while the USB memory apparatus is inserted into a female USB socket; a print circuit board assembly (PCBA) 82 disposed in the housing 81, wherein the PCBA 82 is fixed by means of pressing of the plurality of concave prop 812 (Please refer to FIG. 6, marked as 512); and a LED module having a LED indicator 841 disposed in the housing 81 and a LED module controller 842 disposed on the PCBA 82, wherein there is a space 83 between the housing 81 and the PCBA 82 for facilitating the LED module to be disposed.

In practice, the housing 81 could further include an opening 85 for facilitating the LED indicator 841 to emit light. The housing 81 is usually made from a metallic conductive material, wherein the plurality of orientated indentations 811, the plurality of concave props 812, and the opening 85 are unitary. Similar to the above descriptions, one end of the housing 81 is also regarded as a USB male connector, and then the height of the insertion end of the housing 81 is the same as a standard height of a standard USB male connector. Meanwhile, the plurality of orientated indentations 811 provide a secure fit into the USB socket when inserted. Actually, the housing 81 could also be regarded as an entire case of the USB memory apparatus, thereby decreasing the entire volume of the USB memory apparatus. Similarly, the PCBA 82, equal to FIG. 7, marked 52, could includes a memory controller 521; a storage memory 522 in communication with the memory controller 521; a USB interface circuit 523 in communication with the memory controller 521; and an integrated circuit package 524 for maintaining the memory controller 521, the storage memory 522, and the USB interface 523 together within physical dimensions of the USB memory apparatus, wherein the storage memory 522 is a flash memory or an Electrically Erasable Programmable Read Only Memory (EEPROM). Certainly, the PCBA 82 could introduce any electronic component according to the requirement. In this embodiment, the USB memory apparatus further introduces a LED module without increasing entirety volume thereof. In accordance with the aspect of the present invention, the USB memory apparatus of the present invention could introduce more components by means of using to the space 83 between the housing 81 and the PCBA 82.

In conclusion, the present invention provides a Universal Serial Bus (USB) memory apparatus, which decreases the cost and increases the yield because the flake spacer is not introduced. Moreover, it simplifies the manufacturing process because the PCBA could be propped up by punched concave props instead of uncontrollable flake spacer. Additionally, the USB memory apparatus of the present invention is capable of introducing extra module, such as a LED indicator into the USB memory apparatus without increasing entirety volume thereof by means of using to the space between the housing and the PCBA. On the other hand, the housing could also be regarded as an entire case of the USB memory apparatus directly. Thus, the USB memory apparatus of the present invention can be miniaturized effectively. Certainly, the USB memory apparatus of the present invention could further include a decorated case covering the housing according to the multi-type design. Meanwhile the prior art fail to disclose that. Accordingly, the present invention possesses many outstanding characteristics, effectively improves upon the drawbacks associated with the prior art in practice and application, produces practical and reliable products, bears novelty, and adds to economical utility value. Therefore, the present invention exhibits a great industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A Universal Serial Bus (USB) memory plug, comprising:
   a housing having a plurality of orientated indentations and a plurality of concave props, wherein said plurality of orientated indentation facilitates said USB memory plug to be connected while said USB memory plug is inserted into a female USB socket; and a print circuit board assembly (PCBA) disposed in said housing, wherein said PCBA is fixed by means of pressing of said plurality of concave props, and a space is formed between said housing and said PCBA.

2. The USB memory plug according to claim 1, wherein said housing is made from a metallic conductive material.

3. The USB memory plug according to claim 1, wherein said PCBA further comprises:
   a memory controller;
   a storage memory in communication with said memory controller;
   a USB interface circuit in communication with said memory controller; and
   an integrated circuit package for accommodating said memory controller, said storage memory, and said USB interface circuit together within physical dimensions of said USB memory plug.

4. The USB memory plug according to claim 3, wherein said storage memory is one of a flash memory and an Electrically Erasable Programmable Read Only Memory (EEPROM).

5. The USB memory plug according to claim 1, further comprising a LED indicator for indicating operation of said USB memory plug.

6. The USB memory plug according to claim 5, wherein said PCBA further comprises a LED module controller for controlling said LED indicator.

7. The USB memory plug according to claim 5, wherein said housing further comprises an opening for positioning said LED indicator.

8. The USB memory plug according to claim 1, wherein the plurality of concave props are used to support said PCBA so that a space is formed between said housing and said PCBA.

9. A USB memory plug, comprising:
   a print circuit board assembly (PCBA); and
   a housing having a plurality of concave props, wherein said PCBA is disposed in said housing; said plurality of concave props protrude inward to fix said PCBA, and a space is formed between said housing and said PCBA.

10. The USB memory plug according to claim 9, wherein said housing is made from a metallic conductive material.

11. The USB memory plug according to claim 9, wherein said PCBA further comprises:
    a memory controller;
    a storage memory in communication with said memory controller;
    a USB interface circuit in communication with said memory controller; and
    an integrated circuit package for accommodating said memory controller, said storage memory, and said USB interface circuit together within physical dimensions of said USB memory plug.

12. The USB memory plug according to claim 11, wherein said storage memory is one of a flash memory and an Electrically Erasable Programmable Read Only Memory (EEPROM).

13. The USB memory plug according to claim 9, further comprising a LED indicator for indicating operation of said USB memory plug.

14. The USB memory plug according to claim 13, wherein said PCBA further comprises a LED module controller for controlling said LED indicator.

15. The USB memory plug according to claim 13, wherein said housing further comprises an opening for positioning said LED indicator.

16. The USB memory plug according to claim 9, wherein the plurality of concave props are used to support said PCBA so that said PCBA is not in direct contact with said housing, and a space is formed between said housing and said PCBA.

17. A USB memory plug, comprising:
a housing having a plurality of orientated indentations and a plurality of concave props, wherein said plurality of orientated indentation facilitates said USB memory plug to be connected while said USB memory plug is inserted into a female USB socket;
a print circuit board assembly (PCBA) disposed in said housing, wherein said PCBA is fixed by means of pressing of said plurality of concave props; and
a LED module having a LED indicator disposed in said housing and a LED module controller disposed on said PCBA, wherein a space is formed between said housing and said PCBA for disposing said LED module.

18. The USB memory plug according to claim 17, wherein said housing further comprises an opening for positioning said LED indicator.

19. The USB memory plug according to claim 17, wherein the plurality of concave props are used to support said PCBA so that said PCBA is not in direct contact with said housing, and a space is formed between said housing and said PCBA.

20. The USB memory plug according to claim 17, wherein said PCBA further comprises:
a memory controller;
a storage memory in communication with said memory controller;
a USB interface circuit in communication with said memory controller; and
an integrated circuit package for accommodating said memory controller, said storage memory, and said USB interface circuit together within physical dimensions of said USB memory plug.

21. The USB memory plug according to claim 20, wherein the LED module projects from the integrated circuit package.

* * * * *

(12) INTER PARTES REVIEW CERTIFICATE (88th)
United States Patent
Chung et al.

(10) Number: US 7,518,879 K1
(45) Certificate Issued: Jul. 6, 2015

(54) UNIVERSAL SERIAL BUS (USB) MEMORY PLUG

(75) Inventors: Tom Chung; Dean Huang; Peter Huang

(73) Assignee: PHISON ELECTRONICS CORP.

Trial Numbers:

IPR2013-00472 filed Jul. 29, 2013
IPR2014-00150 filed Nov. 14, 2013

Petitioner: PNY Technologies, Inc.

Patent Owner: Phison Electronics Corp.

Inter Partes Review Certificate for:

Patent No.: 7,518,879
Issued: Apr. 14, 2009
Appl. No.: 11/384,371
Filed: Mar. 21, 2006

The results of joined IPR2013-00472 and IPR2014-00150 are reflected in this inter partes review certificate under 35 U.S.C. 318(b).

INTER PARTES REVIEW CERTIFICATE
U.S. Patent 7,518,879 K1
Trial No. IPR2013-00472
Certificate Issued Jul. 6, 2015

AS A RESULT OF THE INTER PARTES REVIEW PROCEEDING, IT HAS BEEN DETERMINED THAT:

Claims 1-21 are cancelled.

\* \* \* \* \*